(12) United States Patent
Nishibe et al.

(10) Patent No.: US 6,559,504 B2
(45) Date of Patent: May 6, 2003

(54) LATERAL DOUBLE DIFFUSED MOS TRANSISTOR

(75) Inventors: Eiji Nishibe, Gunma (JP); Shuichi Kikuchi, Gunma (JP); Takao Maruyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/039,830

(22) Filed: Jan. 4, 2002

(65) Prior Publication Data

US 2002/0106860 A1 Aug. 8, 2002

Related U.S. Application Data

(62) Division of application No. 09/789,055, filed on Feb. 20, 2001, now Pat. No. 6,399,468.

(30) Foreign Application Priority Data

Apr. 13, 2000 (JP) .......................................... 2000-11227

(51) Int. Cl.[7] ...................... H01L 31/119; H01L 29/76; H01L 31/063; H01L 29/94
(52) U.S. Cl. ...................... 257/343; 257/335; 257/336; 257/344; 257/396
(58) Field of Search .............................. 257/335, 336, 257/337, 343, 344, 395, 396

(56) References Cited

U.S. PATENT DOCUMENTS

| 5,777,363 A | * | 7/1998 | Malhi .......................... 257/343 |
| 6,211,552 B1 | * | 4/2001 | Efland et al. ................ 257/343 |
| 6,424,005 B1 | * | 7/2002 | Tsai et al. .................... 257/335 |
| 6,483,149 B1 | * | 11/2002 | Mosher et al. .............. 257/356 |

FOREIGN PATENT DOCUMENTS

| JP | 2-156543 | 6/1990 |
| JP | 4-25134 | 1/1992 |

* cited by examiner

Primary Examiner—Ngân V. Ngô
(74) Attorney, Agent, or Firm—Fish & RIchardson P.C.

(57) ABSTRACT

To increase the withstand voltage and reduce ON-state resistance, a semiconductor device provided with a gate electrode formed on a semiconductor substrate via a gate insulating film, an LP layer (a P-type body region) formed so that the LP layer is adjacent to the gate electrode, an N-type source region and a channel region respectively formed in the LP layer, an N-type drain region formed in a position apart from the LP layer and an LN layer (a drift region) formed so that the LN layer surrounds the drain region is characterized in that the LP layer is formed up to the side of the drain region through an active region under the gate electrode and an SLN layer is formed from the drain region to a part before the active region.

6 Claims, 10 Drawing Sheets

FIG.17B $$\begin{pmatrix} \text{Vgs10V Step} \\ \text{START:10V, STOP:100V} \end{pmatrix}$$

LATERAL DOUBLE DIFFUSED MOS TRANSISTOR

This is a divisional application of U.S. application Ser. No. 09/789,055 filed Feb. 20, 2001 now U.S. Pat. No. 6,399,468, which in turn claims the benefit of Japanese Application No. 2000-11227 filed Apr. 13, 2000.

BACKGROUND OF THE INVENTION

1. Field of the Invention

The present invention relates to a semiconductor device and a method of manufacturing it, further detailedly relates to lateral double diffused (LD) MOS transistor technique as a high-voltage device utilized for IC for driving a liquid crystal for example and others.

2. Description of the Related Art

LD MOS transistor structure means structure that a new diffused region is formed by diffusing impurities different in a conductive type in a diffused region formed on the side of the surface of a semiconductor substrate and difference in diffusion in a lateral direction between these diffused regions is utilized for effective channel length and a device having the structure is a device suitable for reducing ON-state resistance because a short channel is formed.

Figure 15:
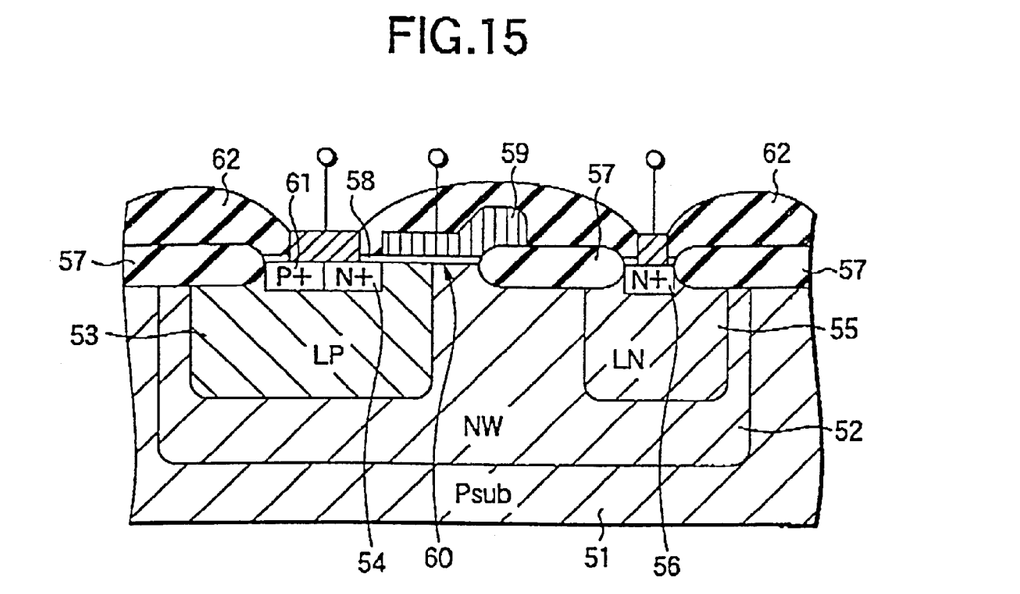
FIGS. 15 and 16 are sectional views each showing a conventional semiconductor device.

FIG. 15 is a sectional view for explaining a conventional type LD MOS transistor and for an example, N-channel LD MOS transistor structure is shown. The description of P-channel LD MOS transistor structure is omitted, however, both structures are different only in a conductive type and it is well-known that they are the similar structure.

As shown in FIG. 15, a reference number 51 denotes one conductive type of, for example, P-type semiconductor substrate, 52 denotes an N-type well region, an LP layer 53 (composing a P-type body region) is formed in the N-type well region 52, an N-type diffused region 54 is formed in the LP layer 53 and an N-type diffused region 56 is formed in an LN layer 55 (composing a drift region) in the N-type well region 52. A local oxide film 57 and a gate electrode 59 via a gate insulating film 58 are formed on the surface of the substrate and a channel region 60 is formed in the superficial region of the LP layer 53 immediately under the gate electrode 59.

The N-type diffused region 54 functions as a source region and the N-type diffused region 56 functions as a drain region. Also, a reference number 61 denotes a P-type layer for applying electric potential to the LP layer 53 and 62 denotes a layer insulation film.

In the LD MOS transistor, the dopant density of the surface of the semiconductor substrate (the LN layer 55) is increased by diffusing the dopant into the surface to form the LN layer 55 as a drift region, current on the surface of the LN layer 55 readily flows and the withstand voltage can be increased.

However, as shown in FIG. 15, the end of the LP layer 53 to be a P-type body region of the LD MOS transistor is under the gate electrode 59 and a range in which the threshold voltage can be regulated exists under an active region.

Therefore, electrostatic focusing at the end of the LP layer 53 and the effect of an electric field from the gate electrode 59 are joined, local current focusing is caused and the driving ability is deteriorated.

Also, as high voltage is applied between the N-type diffused region 56 to be a drain region and the gate electrode 59, the gate insulating film 58 is required to be thickened for high withstand voltage and it prevents further miniaturization.

Figure 16:
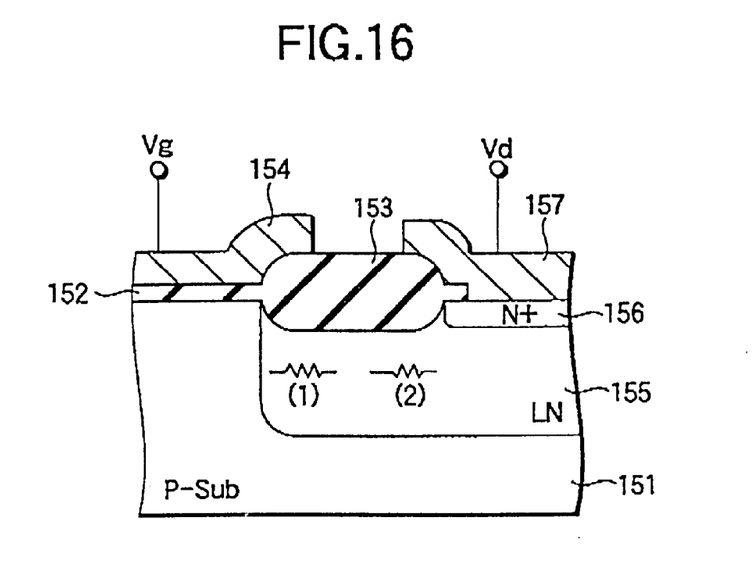

FIG. 16 is a sectional view for explaining the basic configuration of a conventional semiconductor device.

As seen from FIG. 16, an isolation film (not shown) and a first and a second insulating gate 152 and 153 are formed on a semiconductor substrate 151 of a first conduction type, e.g. P-type. A gate electrode 154 is patterned to extend from the first gate insulating film 152 onto a part of the second gate insulating film 153. Lightly-doped source/drain regions 155 and highly-doped source/drain regions 156 constitute a LDD (Lightly Doped Drain) structure. For brevity of illustration, only the side of the drain region is shown. A source/drain electrode is kept in contact with the source/drain region 156.

Figure 17A:
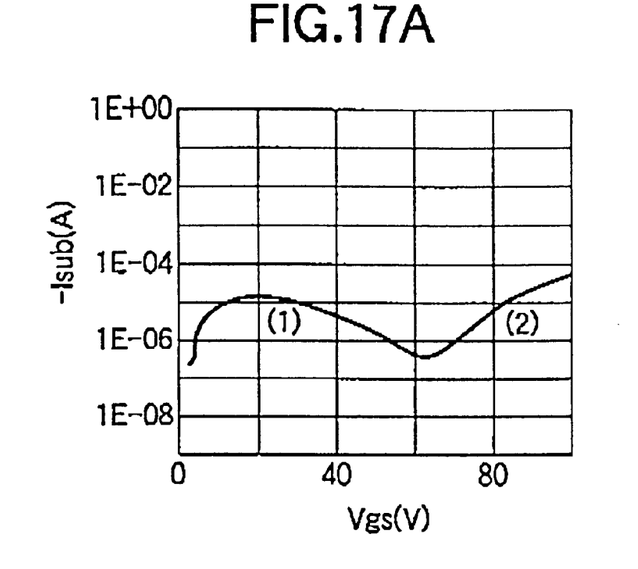
FIGS. 17A and 17B are a graph for explaining the problem of a related art.
Figure 17B:
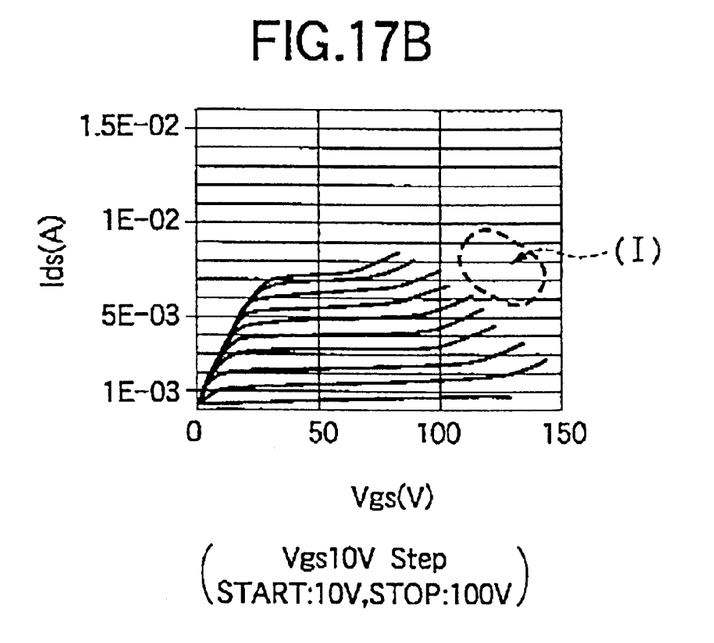

Meanwhile, the locations of the density of an electric field at each voltage Vgs of the above semiconductor device through device simulation have been found by the inventors of this invention. It have been found out that the semiconductor device exhibits different breakdown voltage characteristics according to the distribution of the impurity density of the lightly-doped source/drain region 155. Specifically, as seen from FIGS. 17(a) and 17(b), where the surface density of the source/drain region is relatively low (e.g. about $5 \times 10^{16}/cm^3$), the substrate current Isub have two peaks (double hump structure) as the voltage Vgs increases (FIG. 17(a)). Incidentally, FIG. 17(a) is a characteristic graph (Vds=60 V) showing the substrate current Isub versus the voltage Vgs at the above density. FIG. 17(b) is a characteristic graph of the current Ids versus the voltage Vds.

First, the first peak (1) of the substrate current Isub shown in FIG. 17(a) occurs owing to generation of an electric field from the drain region 155 toward the gate electrode 154 when the voltage Vgs<the voltage Vds. The electric field is concentrated at the first region (1) in FIG. 16.

When the voltage Vgs=the voltage Vds, the potential difference between the drain region 155 and the gate electrode 154 disappears so that substrate Isub becomes minimum.

When the voltage Vgs>the voltage Vds, the resistance of the first region (1) shown in FIG. 16 due to induction of carriers by the voltage Vgs is small whereas application of a voltage to the depletion layer in the second region (2) in FIG. 16 is large due to resistance division. As a result, the electric field in the second region (2) in FIG. 16 is dominant. Thus, the substrate current Isub increases again to provide its second peak (2) shown in FIG. 17(a).

In this way, where the surface density of the lightly-doped source/drain region 155 is lower, the first peak (1) is low. Therefore, this is efficient for the drain breakdown voltage in the range where the voltage Vgs is low. However, the second peak (2) of the substrate Isub is relatively high so that the drain breakdown voltage cannot be maintained in the range where the voltage Vgs is high.

Figure 18A:
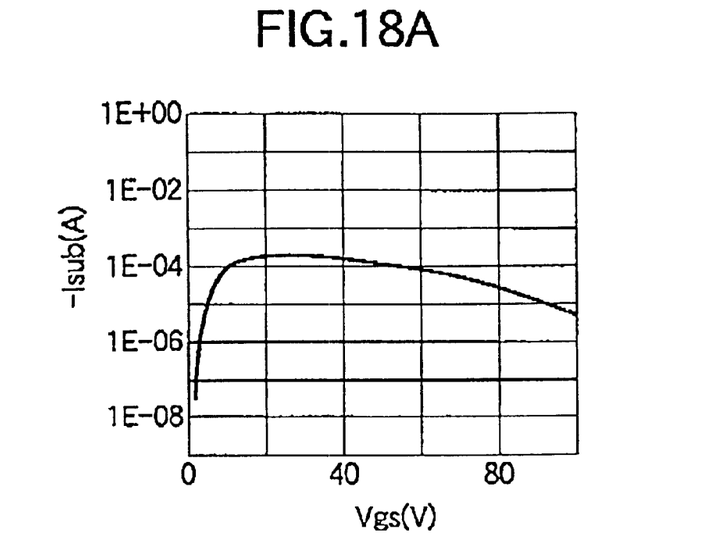
FIGS. 18A and 18B are a sectional view showing a conventional type semiconductor device.
Figure 18B:
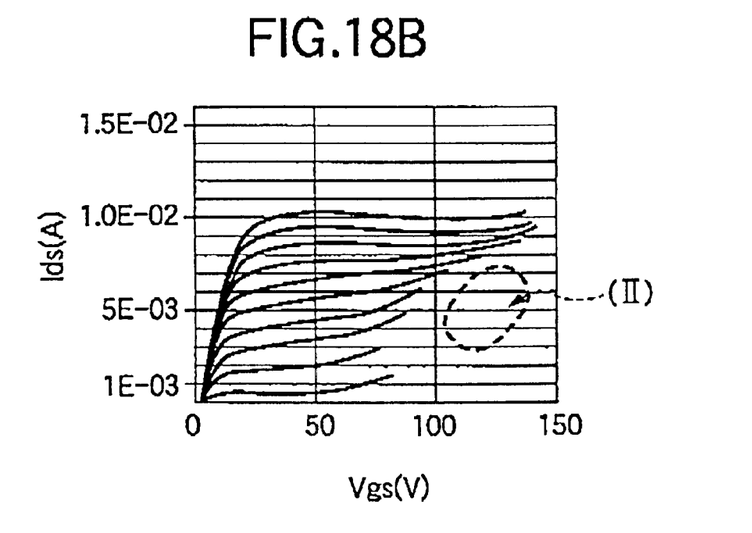

On the other hand, where the surface density of the source/drain region 155 is relatively high (e.g. about $1 \times 10^{17}/cm^3$), as seen from FIG. 18(a), the substrate current Isub has a single peak at a certain Vgs. However, the drain breakdown voltage cannot be maintained in the range where the voltage Vgs is low. Incidentally, FIG. 18(a) is a characteristic graph (Vds=60 V) showing the substrate current Isub versus the voltage Vgs at the above density. FIG. 18(b) is a characteristic graph of the current Ids versus the voltage Vds.

Accordingly, where the lightly-doped source/drain region 155 is relatively low, the breakdown voltage in the range where the voltage Vgs is high cannot be maintained (region (I) in FIG. 17(b)). On the other hand, where the lightly-doped source/drain region 155 is relatively high, the breakdown voltage in the range where the voltage Vgs cannot be maintained (range (II) in FIG. 18(b)).

In order to relax the density of the electric field in the high voltage MOS transistor structure (N-channel), the end of the lightly-doped source/drain region 155 was retracted from the end of the second gate insulating film 153 by about 2 μm (removal width H), thereby realizing a high breakdown voltage of about 80 V. This is because the drain voltage is trapped at the portion of the removal width H because of an increased parasitic resistance at this portion so that the electric filed applied to the transistor body can be increased, thereby realizing a high breakdown voltage of the transistor.

However, the process for realizing the breakdown voltage of 95 V which is being developed involves a further increased electric field as compared with the above process for realizing the breakdown voltage of 80 V so that the end of the lightly-doped source/drain region 155 must be further retracted from the end of the second gate insulating film 153.

In this case, the increase of the removal width H leads to a very large triode threshold voltage (Vt) of the transistor of about 10 V. This makes it very difficult to deal with the transistor.

SUMMARY OF THE INVENTION

This invention has been accomplished in order to overcome the inconveniences of the prior art described above and aims at providing a reliable semiconductor device with reduced local density of a current.

Another object of this invention is to provide a semiconductor device which can optimize the distribution of an impurity density in a lightly-doped source/drain region according to a location of the density of an electric field at each of the above voltages Vgs, and a method of manufacturing such a semiconductor device.

Another object of this invention is to provide a semiconductor device which can reduce a threshold voltage without increasing an electric field applied to a transistor body, and a method of manufacturing such a semiconductor device.

The invention is made to solve the problems and a semiconductor device according to the invention is provided with a gate electrode formed on a semiconductor substrate via a gate insulating film, a first conductive type of body region formed so that the body region is adjacent to the gate electrode, a second conductive type of source region and a channel region respectively formed in the first conductive type of body region, a second conductive type of drain region formed in a position apart from the first conductive type of body region and a second conductive type of drift region formed so that the drift region surrounds the drain region and is characterized in that the first conductive type of body region is formed up to the side of the drain region through an active region under the gate electrode and a second conductive type of impurities layer is formed from the drain region to a part before the active region.

Also, a method of manufacturing the semiconductor device is characterized in that it includes the following processes, first, a second conductive type of well region is formed by introducing (for example, implanting and diffusing) impurities of a second conductive type into/in the first conductive type of semiconductor substrate, and a low density first conductive type of impurities layer and a low density second conductive type of impurities layer are formed at an interval by respectively implanting and diffusing impurities of a first conductive type and impurities of a second conductive type into/in the second conductive type of well region. Next, after impurities of a second conductive type are implanted from the low density second conductive type of impurities layer to a part of the low density first conductive type of impurities layer to form an ion implanted layer, a region on the substrate is selectively oxidized to form a local oxide film and a middle density second conductive type of impurities layer is formed by diffusing the ion implanted layer. A gate insulating film is formed in a region except the local oxide film, and after a gate electrode is formed from the gate insulating film to the local oxide film, impurities of a second conductive type are implanted using resist films respectively having an opening on a source formation region formed in the low density first conductive type of impurities layer and on a drain formation region formed in the low density second conductive type of impurities layer as a mask to form high density source/drain regions.

PREFERRED EMBODIMENT OF THE INVENTION

Referring to the drawings, one embodiment related to a semiconductor device and a method of manufacturing it according to the invention will be described below.

Embodiment 1

FIGS. 1 to 7 are sectional views showing a method of manufacturing an LD MOS transistor according to the invention in the order of each process and for an example, N-channel LD MOS transistor structure is shown. The description of P-channel LD MOS transistor structure is omitted, however, both structures are different only in a conductive type and it is well-known that they are the similar structure.

Figure 1:
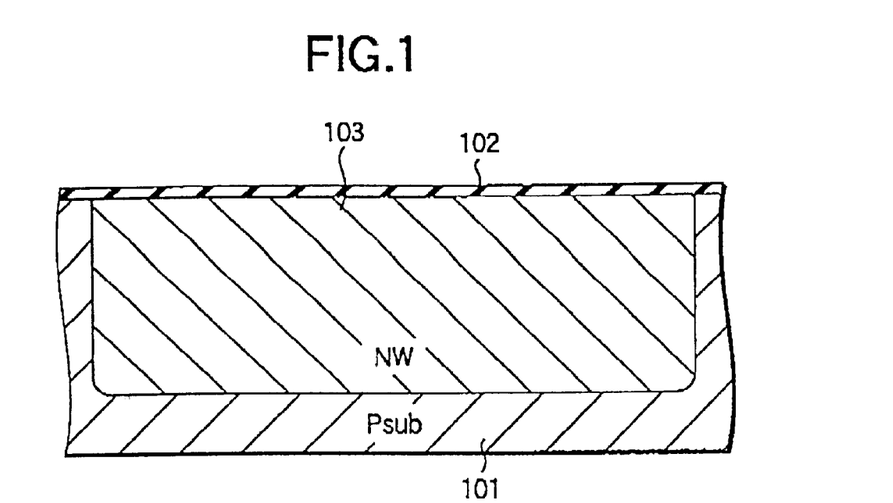
FIGS. 1 to 7 are sectional views showing a step in the method of manufacturing a semiconductor device according to a first embodiment of the invention.

First, as shown in FIG. 1, after a pad oxide film 102 is formed on a P-type semiconductor substrate 101, an N-type well region 103 is formed by implanting and diffusing N-type impurities into/in a desired region of the substrate 101 using a resist film (not shown) as a mask. In this process, for the N-type impurities, for example, phosphorus ions are implanted at the accelerating voltage of approximately 160 KeV on an implantation condition of $5 \times 10^{12}/cm^2$ and are thermally diffused at approximately 1200° C. for 16 hours.

Figure 2:
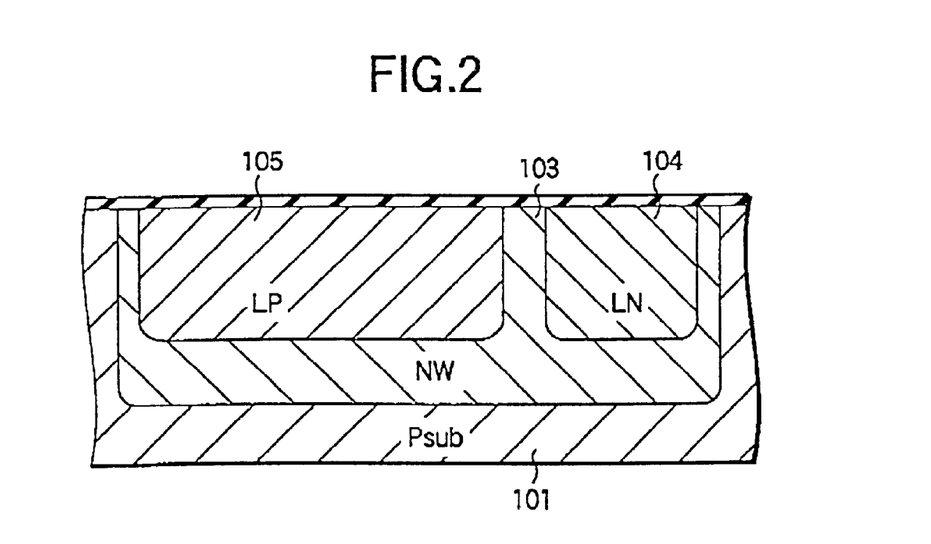

Next, as shown in FIG. 2, N-type impurities are implanted into a desired region of the substrate 101 using a resist film (not shown) formed on the substrate 101 as a mask. Also, similarly, P-type impurities are implanted into a desired region of the substrate 101 using a different resist film as a mask. A low density N-type layer 104 (hereinafter called an LN layer 104) and a low density P-type layer 105 (hereinafter called an LP layer 105) are formed by diffusing implanted each impurities. The LN layer 104 composes a drift region and the LP layer 105 composes a P-type body region. In this process, for the N-type impurities, for example, phosphorus ions are implanted at the accelerating voltage of approximately 100 KeV on an implantation condition of $4 \times 10^{12}/cm^2$, for the P-type impurities, for example, boron ions are implanted at the accelerating voltage of approximately 80 KeV on an implantation condition of $1.2 \times 10^{13}/cm^2$ and each ions are thermally diffused at approximately 1100° C. for four hours.

Figure 3:
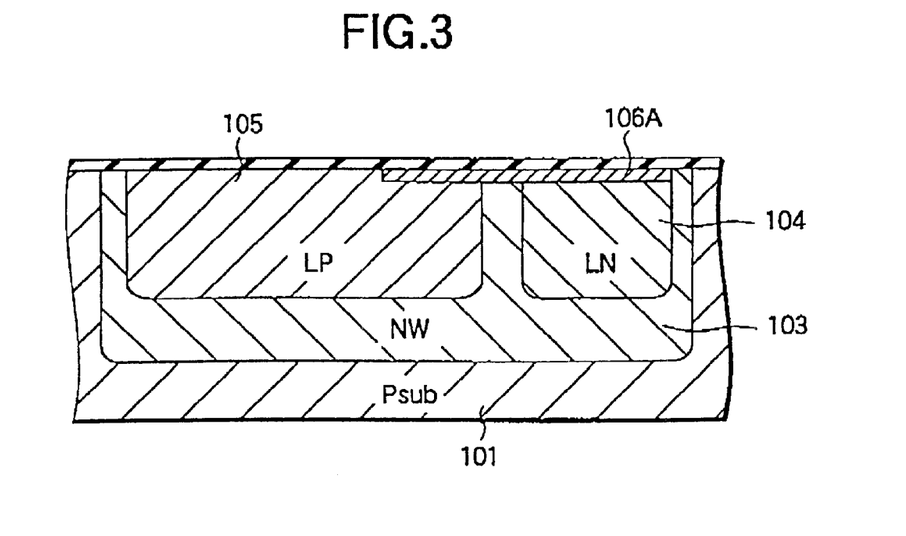

Next, as shown in FIG. 3, N-type impurities are implanted from the low density IN layer 104 to the low density LP layer 105 (to a part under a gate electrode 109 described later) using a resist film (not shown) formed on the substrate 101 as a mask to form an ion implanted layer 6A. In this process, for the N-type impurities, for example, phosphorus ions are implanted at the accelerating voltage of approximately 100 KeV on an implantation condition of $4 \times 10^{12}/cm^2$.

Figure 4:
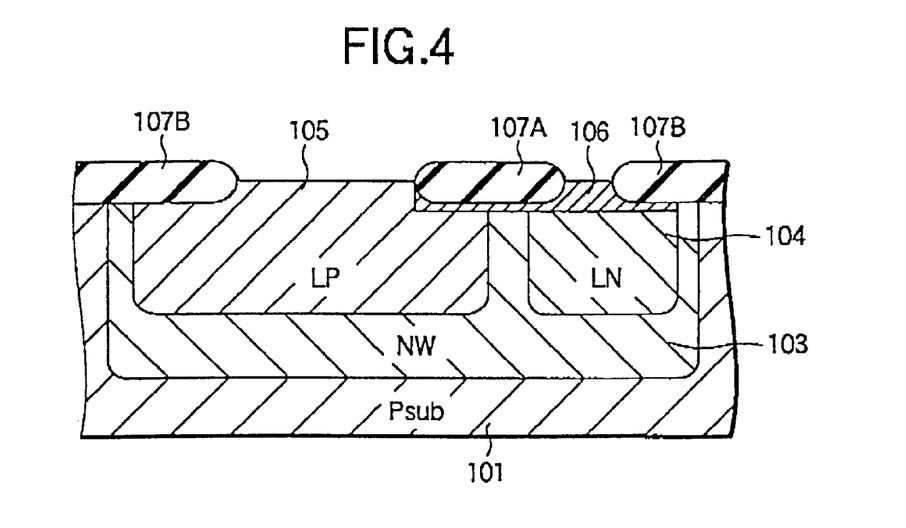

Next, as shown in FIG. 4, a region on the surface of the substrate is selectively oxidized using a silicon nitride film (not shown) formed on the substrate 101 as a mask to form a local oxide film having the thickness of approximately 800 nm (a local oxide film 107A that functions as a gate insulating film together with a gate insulating film 108 described later and a local oxide film 107B as an element isolation film), the ion implanted layer 106A is diffused and a middle density N-type layer 106 (hereinafter called an SLN layer 106) is formed.

Figure 5:
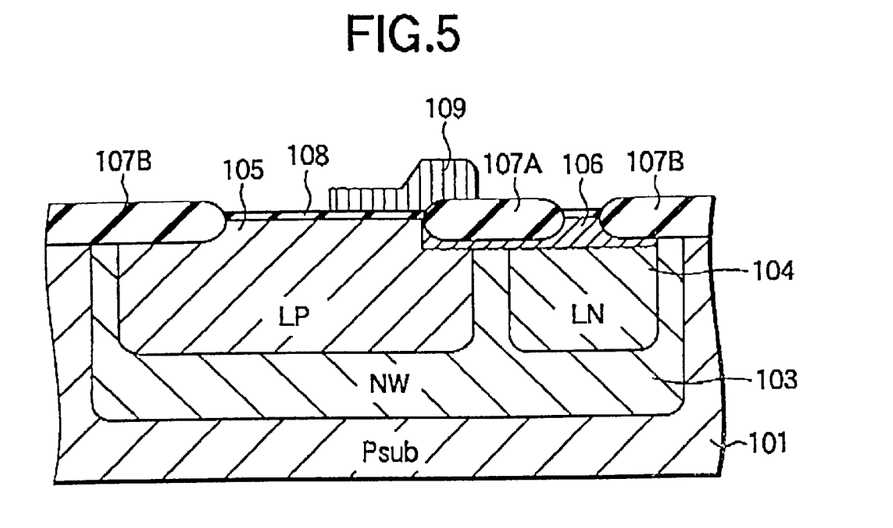

Also, as shown in FIG. 5, a gate insulating film 108 having the thickness of approximately 45 nm is formed on the substrate 1 except the local oxide film 107 by thermal oxidation. As no high voltage is applied between a drain region 11 and a gate electrode 109 because an active region is completely covered with the LP layer 105 though the details are described later, the thickness of the gate insulating film 108 may be similar to the thickness of a gate insulating film of a MOS transistor of 5 V in case no high voltage is applied between a source region 110 and the substrate 101 and therefore, both gate insulating films can be formed in the same process.

After a conductive film is formed on the substrate 101, it is patterned so that it ranges from the gate insulating film 108 to the local oxide film 107A and the gate electrode 109 is formed so that it has the thickness of approximately 400 nm. The gate electrode 109 in this embodiment is composed of a polysilicon film conducted by doping phosphorus using $POCl_3$ as a thermal diffusion source. Further, the gate electrode may be also composed of a polyside electrode acquired by laminating a tungsten silicide (WSix) film and others on the polysilicon film. P-type impurities (for example, boron ions) for regulating the threshold (Vt) are implanted into a channel region 112 under the gate electrode 109 though the impurities are not shown.

Figure 6:
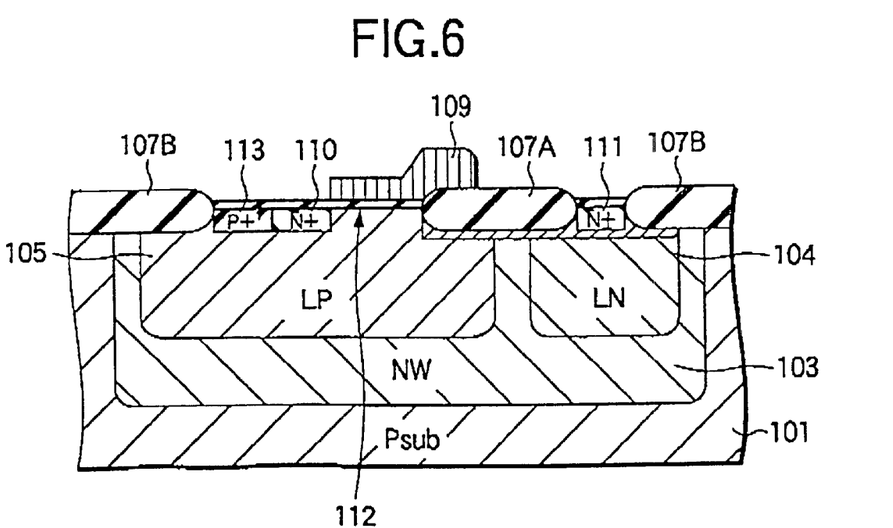

Further, as shown in FIG. 6, N-type impurities are implanted using resist films (not shown) respectively having an opening on a source formation region formed in the LP layer 105 (the P-type body region) and on a drain formation region formed in the LN layer 104 (the drift region) as a mask, and an N-type diffused region 110 (hereinafter called the source region 110) and an N-type diffused region 111 (hereinafter called the drain region 111) are formed. In this process, a source region and a drain region in so-called DDD structure are formed by implanting phosphorus ions for example by the quantity of $1 \times 10^{14}/cm^2$ at the accelerating voltage of approximately 70 KeV and further, implanting arsenic ions for example by the quantity of $6 \times 10^{15}/cm^2$ at the accelerating voltage of approximately 80 KeV. Further, the structure of the source region 110 and the drain region 111 is not limited to the DDD structure and may be also so-called LDD structure.

A high density P-type layer 113 is formed in a position adjacent to the source region 10 to apply electric potential to the LP layer 105 (the P-type body region). In this process, the P-type layer 113 is formed by implanting boron ions for example for P-type impurities by the quantity of $2 \times 10^{15}/cm^2$ at the accelerating voltage of approximately 30 KeV.

Figure 7:
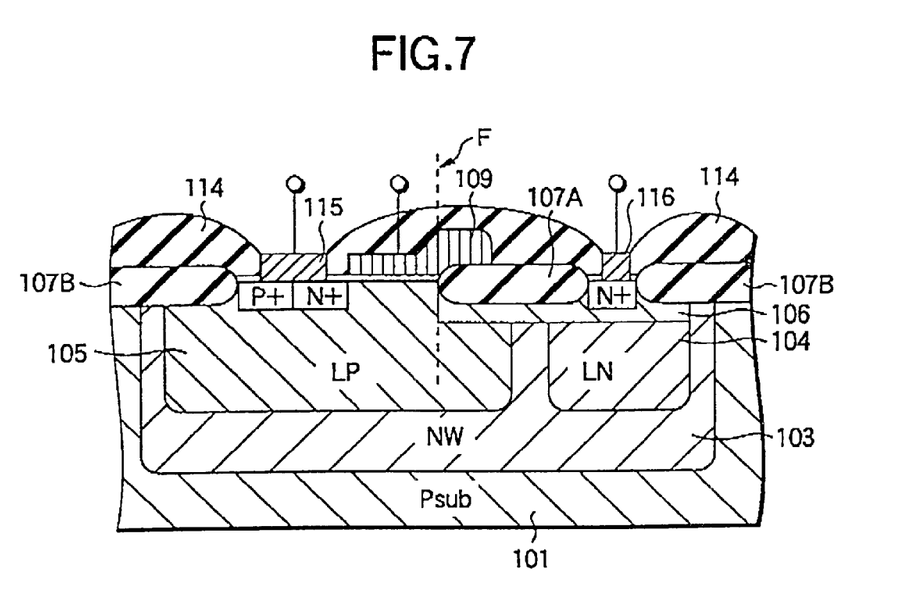

As shown in FIG. 7, after a source electrode 115 and a drain electrode 116 are formed via a layer insulation film 114 as in conventional type configuration, a passivation film (not shown) is formed and the semiconductor device is completed.

As described above, in the invention, the end of the LP layer 105 as the P-type body region is extended up to the direction of the drain region 111 through the end (the end F shown by a dotted line in FIG. 7) of the active region and a shallow SLN layer 106 as a current path that reaches the end F through the local oxide film 107A from the LN layer 104 is formed so that the SLN layer corresponds to the extended region. In this embodiment, the SLN layer 106 is 1 μm or less deep in which it is capable to completely deplete. Further, the SLN layer 106 may be formed deep in case it functions only as a current path, however, in the invention, the driving ability can be more enhanced by forming the SIN layer shallowly and densely.

As described above, in the invention, it is avoided for current to focus locally by extending the end of the LP layer which is a location where electrostatic focusing occurs up to a range outside a range in which the multiplier effect of electrostatic focusing occurs and the driving ability of the semiconductor device can be enhanced.

Also, the SLN layer 106 functions as a reduced surface field type (RESURF), electrostatic focusing is relaxed and drain withstand voltage can be increased. Further, as the SLN layer 106 is shallow, it is completely depleted even if the density is high, the SLN layer 106 can be made dense to utilize the effect of surface relaxation, ON-state resistance can be reduced and the driving ability can be enhanced.

The above helps locations where electrostatic focusing occurs in relation to the gate electrode to be dispersed.

Further, the whole active region can be covered with the LP layer 5 and in case no high voltage is applied between the drain region and the gate electrode, for example input voltage to the gate electrode 109 is 5V, the gate insulating film 8 can be thinned up to the same extent as the thickness in a system of 5V and the driving ability can be enhanced.

According to the invention, as the end of the P-type body region is extended up to the direction of the drain region through the end of the active region and a current path that reaches the active region from the drift region is formed, locations where electrostatic focusing occurs can be dispersed, it can be avoided for current to focus locally and the driving ability of the semiconductor device can be enhanced.

Also, no high voltage is applied between the drain region and the gate electrode by covering the whole active region with the P-type body region and in case input voltage to the gate electrode is 5V for example, the gate insulating film can be thinned up to the same extent as the thickness in a system of 5V and the driving ability can be enhanced.

Now referring to the drawings, an explanation will be given of a second embodiment of the semiconductor device according to this invention and its manufacturing method.

Embodiment 2

Figure 13:
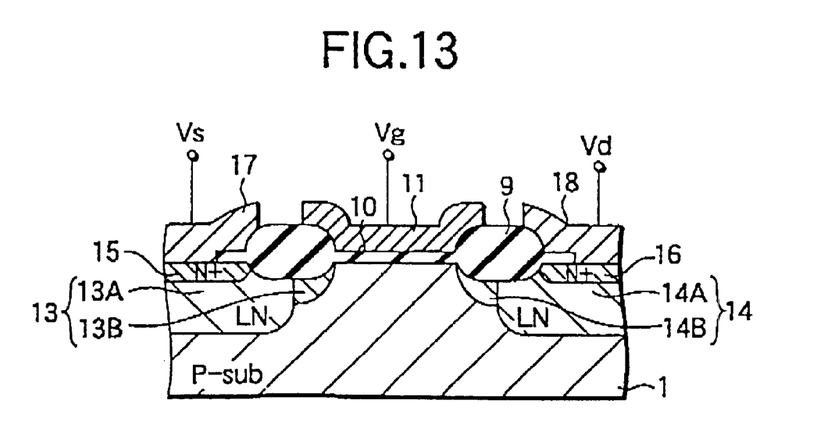

Referring to FIG. 13, an isolation film (inclusive of a selective oxide film 9) and a gate oxide film 10 are formed on a semiconductor substrate 1 of a first conduction type, e.g. P-type (doped at a density of about $3 \times 10^{14}/cm^3$). A gate electrode 11 is patterned on the gate oxide film 10. Lightly doped source/drain regions 13, 14 and highly doped source/drain regions 15, 16 constitute a semiconductor device (MOS transistor) in an LDD (Lightly doped Drain) structure.

The feature of this invention resides in that the above source/drain regions 13 and 14 consist of first impurity regions 13A, 14A formed at the positions of the substrate surface retracted from the end of the selective oxide film 9 and second impurity regions 13B, 14B formed so as to be adjacent to the vicinity of the boundary between the gate oxide film 10 and the selective oxide film 9 and more lightly-doped than the first impurity regions 13A, 14A. In this way, since the lightly-doped source/drain regions are formed according to the locations where an electric field is concentrated, this invention can deal with various breakdown voltages. Specifically, the conventional first region (1) (FIGS. 16 and 17) is formed by the lightly-doped second impurity regions 13B, 14B (surface density: about $5 \times 10^{16}/cm^3$) to provide a low Vgs voltage and the second region (2) is formed by the lightly-doped source/drain regions 13A, 14A (surface density: about $1 \times 10^{17}/cm^3$) which are more highly doped than the second impurity regions 13B, 14B to provide a high Vgs voltage.

Further, the diffusion depth Xj of the first impurity regions 13A, 14A is about 1.5 $\mu$m whereas the diffusion depth Xj of the second impurity regions 13B, 14B is 0.5 $\mu$m so that a reduced surface field type structure (RESURF) at the second impurity regions 13B, 14B can be realized so that the semiconductor device can have a high breakdown voltage characteristic. Such RESURF technique is disclosed in e.g. JP-A-9-139438.

An explanation will be given of the method of manufacturing the semiconductor device described above.

Figure 8:
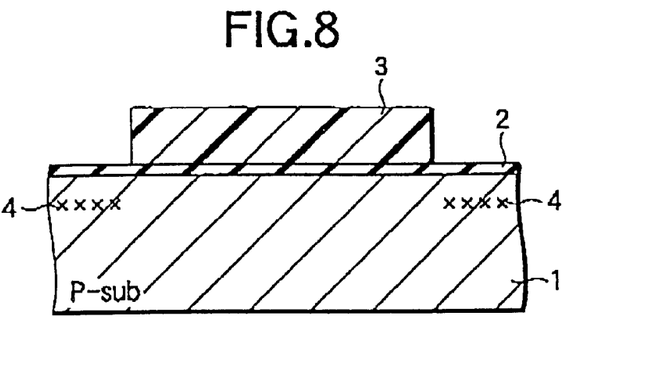
FIGS. 8 to 13 are sectional views each showing a step in the method of manufacturing a semiconductor device according to a second embodiment of this invention.

First, as seen from FIG. 8, a dummy oxide film 2 is formed on the substrate 1 (density: about $3 \times 10^{14}/cm^3$). Thereafter, using as a mask a first resist film (for forming the first impurity regions 13A, 14A) 3, first impurities (e.g. phosphorus ions, arsenic ions) are ion-implanted to form a first ion-implanted layer 4. In this step, e.g. phosphorus ions are ion-implanted at an accelerating voltage of 100 KeV and with a dose of $5 \times 10^{12}/cm^2$.

Figure 9:
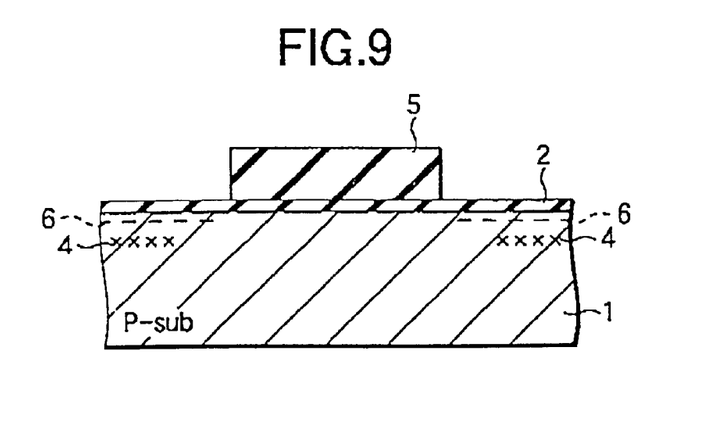

As seen from FIG. 9, second impurities (e.g., arsenic ions, phosphorus ions) are ion-implanted in the substrate surface to form a second ion-implanted layer 6. In this step, e.g. arsenic ions are ion-implanted at an accelerating voltage of 160 KeV and with a dose of $2 \times 10^{12}/cm^2$.

Figure 10:
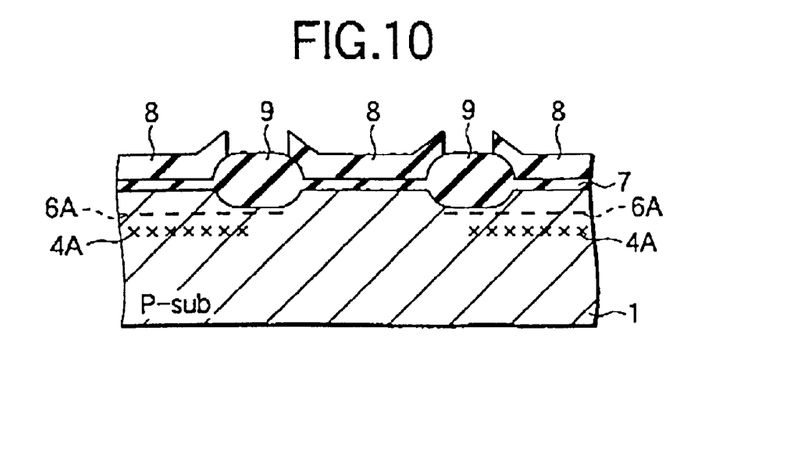

As seen from FIG. 10, using as a mask a silicon nitride film 8 having an opening formed on a pad oxide film 7 on the substrate 1, the substrate surface is thermally oxidized to form a selective oxide film 9 and an isolation film on the substrate. Incidentally, before this heat treatment, a diffusion step for forming lightly-doped layers has been performed so that the first and the second ion-implanted layers 4 and 6 are diffused into the substrate to constitute a first and a second ion-implanted layer 4A and 6A (lightly-doped source/drain regions 13 and 14 which will be described later).

Figure 11:
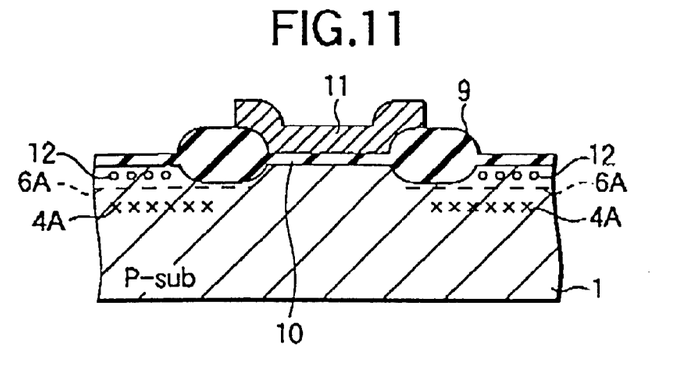

Further, as seen from FIG. 11, the substrate surface is thermally oxidized to form a gate oxide film 10 in the other substrate region than the selective oxide film 9. Subsequently, after a conductive film (e.g. phosphorus-doped polysilicon film, or a stacked film consisting of the polysilicon film and a tungsten silicide) has been formed, the conductive film is patterned to form a gate electrode 11 which extends from the gate oxide film 10 over a part of the selective oxide film 9. Further, using as a mask the selective oxide film 9 and the gate electrode film 11, third impurities (e.g. arsenic ion, phosphorus ions) are diffused into the substrate surface layer to form a third ion-implanted layer 12. In this step, e.g. arsenic ions are ion-implanted at an accelerating voltage of 80 KeV and with a dose of $6 \times 10^{15}/cm^2$.

Figure 12:
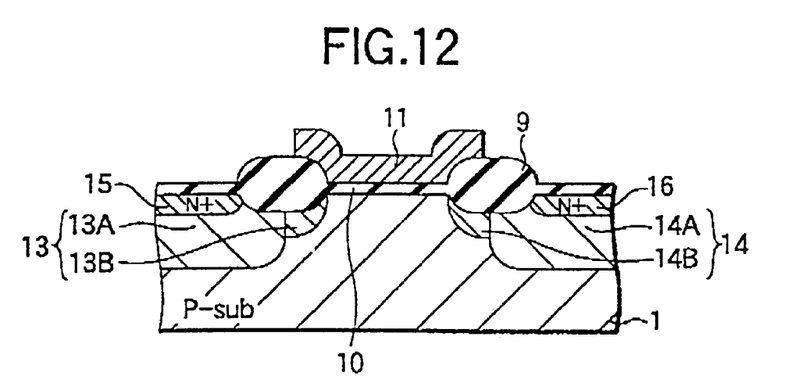

Thereafter, as seen from FIG. 12, the substrate is subjected to annealing so that the first, second and third impurities ion-implanted in the substrate surface are diffused to form lightly-doped source/drain regions 13A and 14A (surface density: about $1 \times 10^{17}/cm^3$) having first and second impurity density distributions, and highly doped source/drain regions 15 and 16 (density: about $5 \times 10^{16}/cm^3$) having a third impurity density distribution.

As shown in FIG. 13, source/drain electrodes 17 and 18, which are in contact with the highly-doped source/drain regions 15 and 16 through an interlayer insulating film (not shown) formed on the entire substrate surface, are formed thereby completing the semiconductor device.

As understood from the description hitherto made, since the lightly-doped source/drain regions 13 and 14 are formed according to the locations where an electric field is concentrated, this invention can deal with various breakdown voltages. Thus, it has been found that this invention could boost the breakdown voltage from about 80 V in the prior art to about 95 V.

Additionally, in this embodiment, an N-channel MOS transistor has been formed on a p-type semiconductor layer (substrate or well region). However, likewise, a P-channel type MOS transistor can be formed on an N-type semiconductor layer (substrate or well region).

Further, in this embodiment, the gate electrode 11 has been formed through the selective oxide film 9 on both sides of the source/drain region. However, the gate electrode 11 may be formed through the selective oxide film 9 on the one side (e.g. on the side of the drain region).

In accordance with this invention, since the lightly-doped source/drain regions are formed by the first impurity region and the second impurity region according to the locations where an electric field is concentrated, this invention can deal with various breakdown voltages. Adoption of the RESURF structure permits the breakdown voltage to be further boosted.

Embodiment 3

The feature of the semiconductor device according to this embodiment resides in that the lightly-doped N-type impurity regions 13C and 14C in the semiconductor device according to the second embodiment are formed deeper than the lightly-doped source/drain regions 13A and 14A.

Figure 14:
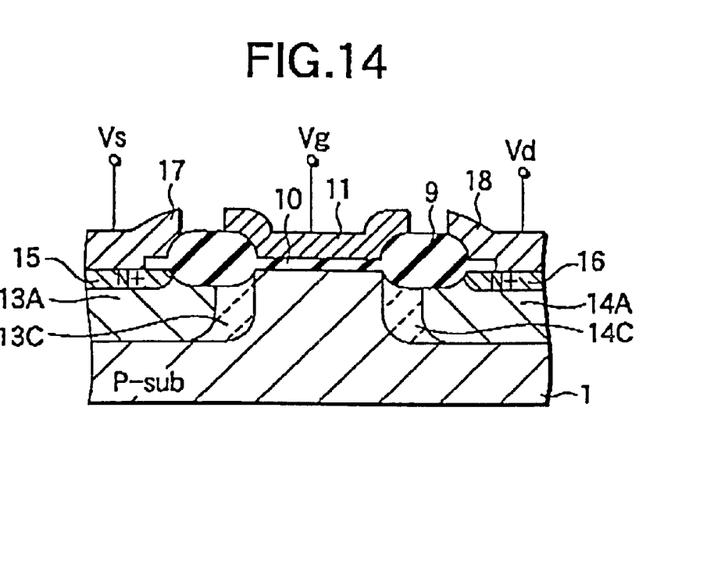
FIG. 14 is a sectional view showing a semiconductor device according to a third embodiment of this invention.

Specifically, as shown in FIG. 14, the semiconductor device according to this embodiment comprises a gate oxide film 10 and a selective oxide film 9 being thicker than the gate oxide film which are formed on a P-type semiconductor substrate 1, a gate electrode 11 which is formed on the gate oxide film 10 and partially extends over the selective oxide film 9, lightly-doped N-type source/drain regions 13A and 14A which are formed on the surface of the substrate at the position retracted from the one end of the selective oxide film 9 adjacent to the gate electrode, and highly-doped N-type source/drain regions formed on the surface of the substrate adjacent to the other end of the selective oxide film 9, and is characterized in that more lightly-doped N-type impurity regions 13C and 14C for reducing the threshold voltage are formed to extend from the one end of the selective oxide film 9 to the end of the lightly-doped source/drain regions 13A and 14.

The semiconductor device according to this embodiment can be manufactured by the method comprising the following steps. As shown in FIG. 8, using a first resist film as a mask, first impurities of N-type are ion-implanted in a surface layer of a P-type semiconductor substrate, and thereafter, as shown in FIG. 9, using a second resist film 5, second impurities of N-type are ion-implanted in the surface layer so that the first and the second impurities are diffused as shown in FIG. 10. Next, after a silicon nitride film 8 having an opening has been formed on the substrate, the substrate surface is thermally oxidized using the silicon nitride film 8 as a mask so that a selective oxide film 9 is formed on the substrate. Subsequently, the substrate is thermally oxidized to form a gate oxide film 10 on the other substrate regions than the selective oxide film 9, and thereafter a gate electrode 11 is formed to extend from the gate oxide film onto a part of the selective oxide film 9. Next, using as a mask the selective oxide film 9 and the gate electrode 11, third impurities of N-type are ion-implanted on the surface layer of the substrate. The substrate is subjected to annealing so that the first, and third impurities ion-implanted in the surface layer of the substrate are diffused to form lightly-doped N-type source/drain regions 13A and 14A on the surface layer of the substrate at the position retracted from the one end of the selective oxide film 9, and to form highly-doped N-type source/drain regions 15 and 16 on the surface layer of the substrate so as to be adjacent to the other end of the selective oxide film 9. Further, the second impurities are diffused to form lightly-doped N-type impurity regions 13C and 14C for reducing the threshold voltage from the one end of the selective oxide film 9 to the end of the lightly-doped source/drain regions 13A and 14A.

Referring to FIG. 14, an isolation film (inclusive of a selective oxide film 9) and a gate oxide film 10 are formed on a semiconductor substrate 1 of a first conduction type, e.g. P-type (doped at a density of about $3 \times 10^{14}/cm^3$). A gate electrode 11 is patterned on the gate oxide film 10. Lightly doped source/drain regions 13A, 14A and highly doped source/drain regions 15, 16 constitute a semiconductor device (MOS transistor) in an LDD (Lightly doped Drain) structure.

The feature of this invention resides in that in the above semiconductor device in which the lightly-doped source/drain regions 13A and 14A are arranged at the positions retracted from the end of the selective oxide film constituting the second gate oxide film 9 in order to boost the breakdown voltage, the "channel bridging" lightly-doped impurity regions 13C and 14C (surface density: about $5 \times 10^{16}/cm^3$) for "channel bridging" or reduce the triode threshold voltage (Vt) are formed to extend from the end of the selective oxide film 9 onto the lightly-doped source/drain regions 13A and 14A.

In the structure of the semiconductor device according to this embodiment, without increasing the electric field applied to the transistor body, the threshold voltage (Vt) could be reduced to the value approximately equal to that of an ordinary device. Incidentally, for example, in the high voltage (about 95V) MOS transistor, its threshold voltage (Vt) could be reduced to about 1.5 V (about 10 V in the conventional structure).

Additionally, it is not required to manage the diffusion depth Xj of the impurity regions 13C and 14C because their provision intends to fall the threshold voltage (Vt). Therefore, the manufacturing process is not complicated.

The method of manufacturing the semiconductor device according to this embodiment is substantially the same as that in the second embodiment.

As understood from the description hitherto made, in the conventional semiconductor device (FIG. 16) in which the end of the lightly-doped source/drain region 155 is retracted from the end of the second gate insulating film 153 to boost the breakdown voltage, in accordance with this invention, the lightly-doped N-type impurity regions 13C and 14C for "channel bridging" are formed to extend from the end of the selective oxide film 9 onto the lightly-doped source/drain regions 13A and 14A so that the threshold voltage can be reduced.

Additionally, in this embodiment, an N-channel MOS transistor has been formed on a p-type semiconductor layer (substrate or well region). However, likewise, a P-channel type MOS transistor can be formed on an N-type semiconductor layer (substrate or well region).

Further, in this embodiment, the gate electrode 11 has been formed through the selective oxide film 9 on both sides of the source/drain region. However, the gate electrode 11 may be formed through the selective oxide film 9 on the one side (e.g. on the side of the drain region).

In accordance with this invention, since the lightly-doped impurity regions for reducing the threshold voltage (or channel bridging) are formed to extend from the second gate oxide film onto the lightly-doped source/drain regions, the threshold voltage can be reduced without increasing the electric field applied to the transistor itself.

What is claimed is:

1. A semiconductor device comprising:

a gate electrode formed on a semiconductor substrate via a gate insulating film;

a first conductive type of body region formed so that the body region is adjacent to the gate electrode;

a second conductive type of source region and a channel region respectively formed in the first conductive type of body region;

a second conductive type of drain region formed in a position apart from the first conductive type of body region and a second conductive type of drift region formed so that the drift region surrounds the drain region, wherein the first conductive type of body region is extended up to the side of the drain region through an active region under the gate electrode; and a second conductive type of impurities layer is formed from the drain region up to near the active region.

2. A semiconductor device according to claim 1, wherein:

the second conductive type of impurities layer is denser than the second conductive type of drift region; and the density of the second conductive type of impurities layer is lower than that of the second conductive type of drain region.

3. A semiconductor device according to claim 2, wherein said gate insulating film includes a first insulating film and a second insulating film of a selective oxide film which is thicker than said first insulating film, said gate electrode is formed extend over said first insulating film and said second insulating film and the impurity layer of said second conduction type is arranged to abut on the bottom of said second insulating film.

4. A semiconductor device according to claim 2, wherein said gate insulating film includes a first insulating film and a second insulating film of a selective oxide film which is thicker than said first insulating film, said gate electrode is formed extend over said first insulating film and said second insulating film and said impurity layer of the second conduction type is arranged to cover the bottom of said second insulating film.

5. A semiconductor device according to claim 4, wherein said impurity region of the second conduction type is arranged to cover the entire bottom of said second insulating film.

6. A semiconductor device according to claim 5, wherein said impurity layer of the second conduction type extends from said body region of the first conduction type and terminates at a position closer to the source from the edge of the gate insulating film.

* * * * *